(12) United States Patent
Xu et al.

(10) Patent No.: US 7,446,375 B2
(45) Date of Patent: Nov. 4, 2008

(54) QUASI-VERTICAL LDMOS DEVICE HAVING CLOSED CELL LAYOUT

(75) Inventors: Shuming Xu, Schnecksville, PA (US); Jacek Korec, Sunrise, FL (US)

(73) Assignee: Ciclon Semiconductor Device Corp., Bethlehem, PA (US)

(*) Notice: Subject to any disclaimer, the term of this patent is extended or adjusted under 35 U.S.C. 154(b) by 127 days.

(21) Appl. No.: 11/376,470

(22) Filed: Mar. 14, 2006

(65) Prior Publication Data

US 2007/0215939 A1 Sep. 20, 2007

(51) Int. Cl.
H01L 29/76 (2006.01)
H01L 31/62 (2006.01)

(52) U.S. Cl. .............. 257/336; 257/327; 257/335; 257/344; 257/408

(58) Field of Classification Search .......... 257/336, 257/327, 335, 344, 408
See application file for complete search history.

(56) References Cited

U.S. PATENT DOCUMENTS

| | | | |
|---|---|---|---|
| 4,455,565 A | 6/1984 | Goodman et al. |
| 4,754,310 A | 6/1988 | Coe |
| 5,155,563 A | 10/1992 | Davies et al. |
| 5,216,275 A | 6/1993 | Chen |
| 5,252,848 A | 10/1993 | Adler et al. |
| 5,625,226 A | 4/1997 | Kinzer |
| 5,841,166 A | 11/1998 | D'Anna et al. |
| 5,907,173 A | 5/1999 | Kwon et al. |
| 5,912,490 A | 6/1999 | Hebert et al. |
| 5,949,104 A | 9/1999 | D'Anna et al. |
| 5,977,630 A | 11/1999 | Woodworth et al. |
| 6,001,710 A | 12/1999 | Francois et al. |
| 6,040,626 A | 3/2000 | Cheah et al. |
| 6,075,286 A | 6/2000 | Ewer |
| 6,215,152 B1 | 4/2001 | Hebert |
| 6,242,800 B1 | 6/2001 | Munos et al. |
| 6,372,557 B1 | 4/2002 | Leong |
| 6,396,127 B1 | 5/2002 | Munoz et al. |
| 6,404,050 B2 | 6/2002 | Davis et al. |
| 6,482,680 B1 | 11/2002 | Khor et al. |
| 6,489,678 B1 | 12/2002 | Joshi |
| 6,521,923 B1 | 2/2003 | D'Anna et al. |
| D471,165 S | 3/2003 | Williams et al. |
| D472,528 S | 4/2003 | Kasem et al. |

(Continued)

OTHER PUBLICATIONS

Cheon Soo Kim et al., Trenched Sinker LDMOSFET (TS-LDMOS) Structure for High Power Amplifier Application above 2 GHz, IEEE No. 0-7803-7050-3/01, 2001, pp. IEDM 01-887-IEDM 01-890.

(Continued)

Primary Examiner—Kimberly D Nguyen
Assistant Examiner—Tony Tran
(74) Attorney, Agent, or Firm—Duane Morris LLP (57) ABSTRACT

A low voltage power device includes a plurality of quasi-vertical LDMOS device cells. A conductive trench sinker is formed through the epitaxial layer and adjacent a selected one of the source and drain regions in each cell. The trench sinker electrically couples the selected one of the source and drain regions to the substrate for coupling current from the channel to the substrate. The resulting device exhibits a vertical current flow between the metal electrode covering the front surface and the second electrode formed at the back side of the wafer. The device cells are arranged in a closed cell configuration.

22 Claims, 7 Drawing Sheets

U.S. PATENT DOCUMENTS

| | | |
|---|---|---|
| 6,586,824 B1 | 7/2003 | Glenn et al. |
| 6,593,622 B2 | 7/2003 | Kinzer et al. |
| 6,600,182 B2 | 7/2003 | Rumennik |
| 6,611,047 B2 | 8/2003 | Hu et al. |
| 6,617,655 B1 | 9/2003 | Estacio et al. |
| 6,627,950 B1 | 9/2003 | Bulucea et al. |
| 6,627,976 B1 | 9/2003 | Chung et al. |
| 6,630,726 B1 | 10/2003 | Crowley et al. |
| 6,639,308 B1 | 10/2003 | Crowley et al. |
| 6,645,791 B2 | 11/2003 | Noquil et al. |
| 6,646,329 B2 | 11/2003 | Estacio et al. |
| 6,653,740 B2 | 11/2003 | Kinzer et al. |
| 6,661,082 B1 | 12/2003 | Granada et al. |
| 6,677,641 B2 | 1/2004 | Kocon |
| 6,677,663 B1 | 1/2004 | Ku et al. |
| 6,677,669 B2 | 1/2004 | Standing |
| 6,696,321 B2 | 2/2004 | Joshi |
| 6,696,747 B1 | 2/2004 | Lee et al. |
| 6,700,187 B2 | 3/2004 | Paek |
| 6,707,138 B2 | 3/2004 | Crowley et al. |
| 6,713,322 B2 | 3/2004 | Lee |
| 6,723,582 B2 | 4/2004 | Glenn et al. |
| 6,744,124 B1 | 6/2004 | Chang et al. |
| 6,753,605 B2 | 6/2004 | Joshi |
| 6,756,658 B1 | 6/2004 | Gillett et al. |
| 6,762,067 B1 | 7/2004 | Quinones et al. |
| 6,818,973 B1 | 11/2004 | Foster |
| 6,831,332 B2 | 12/2004 | D'Anna et al. |
| 6,838,309 B1 | 1/2005 | McCann |
| 6,844,615 B1 | 1/2005 | Edwards et al. |
| 6,846,704 B2 | 1/2005 | Paek |
| 6,847,103 B1 | 1/2005 | Perez et al. |
| 6,853,060 B1 | 2/2005 | Seok et al. |
| 6,858,919 B2 | 2/2005 | Seo et al. |
| 6,873,041 B1 | 3/2005 | Crowley et al. |
| 7,126,193 B2 | 10/2006 | Baiocchi |
| 7,166,496 B1 | 1/2007 | Lopez |
| 7,235,845 B2 | 6/2007 | Xu |
| 7,282,765 B2 | 10/2007 | Xu |
| 2001/0030362 A1 | 10/2001 | Grant |
| 2001/0045627 A1 | 11/2001 | Connah et al. |
| 2001/0048116 A1 | 12/2001 | Standing et al. |
| 2001/0048154 A1 | 12/2001 | Cheah et al. |
| 2001/0052639 A1 | 12/2001 | Jeon et al. |
| 2002/0008319 A1 | 1/2002 | Davis et al. |
| 2002/0017697 A1* | 2/2002 | Kitamura et al. ............ 257/492 |
| 2002/0066950 A1 | 6/2002 | Joshi |
| 2002/0070441 A1 | 6/2002 | Cheah |
| 2002/0135079 A1 | 9/2002 | Shivkumar et al. |
| 2002/0163040 A1 | 11/2002 | Kinzer et al. |
| 2003/0011005 A1 | 1/2003 | Joshi |
| 2003/0016505 A1 | 1/2003 | Jauregui |
| 2003/0067071 A1 | 4/2003 | Cardwell |
| 2003/0075786 A1 | 4/2003 | Joshi et al. |
| 2003/0107126 A1 | 6/2003 | Joshi et al. |
| 2003/0122247 A1 | 7/2003 | Joshi et al. |
| 2004/0021233 A1 | 2/2004 | Kinzer et al. |
| 2004/0061221 A1 | 4/2004 | Schaffer |
| 2004/0159939 A1 | 8/2004 | Joshi et al. |
| 2004/0164386 A1 | 8/2004 | Joshi et al. |
| 2004/0201086 A1 | 10/2004 | Joshi et al. |
| 2005/0017298 A1 | 1/2005 | Xie et al. |
| 2005/0017299 A1 | 1/2005 | Shen |
| 2005/0280087 A1* | 12/2005 | Babcock et al. ............ 257/343 |
| 2007/0034942 A1 | 2/2007 | Xu |
| 2007/0040254 A1 | 2/2007 | Lopez |
| 2007/0085204 A1 | 4/2007 | Korec |

OTHER PUBLICATIONS

Yasuhara, Matsushita et al., "Low Gate Charge 30 V N-channel LDMOS for DC-DC converters," International Symposium On Power Semiconductor Devices & ICS (15th: 2003: Cambridge, England) (4 pages).

Xu, Baiocchi et al., "High Power Silicon RF LDMOSFET Technology for 2.1 GHZ Power Amplifier Applications," IEE Proceedings—Circuits Devices Syst. vol. 151, No. 3, Jun. 2004 pp (4 pages).

Xu, Shibib et al., "High Performance RF Power LDMOSFET Technology for 2.1 GHZ Power Amplifier Applications," Microwave Symposium Digest, 2003 IEEE MTT-S International Publication Date: Jun. 8-13, 2003 vol. 1, pp. 217-220.

Andy Strachan and Doug Bribin, "Optimization of LDMOS Array Design for SOA and Hot Carrier Lifetime," 2003 IEEE 15$^{TH}$ International Symposium on Power Semiconductor Devices and ICs, 2003 Proceedings, ISPSD '03, pp. 84-87.

Anthony Murray et al., "New Power MOSFET Technology with Extreme Ruggedness and Ultra-Low $R_{DS(on)}$ Qualified to Q101 for Automotive Applications," Proceedings of PCIM 2000 Europe, Official Proceedings of the 41$^{st}$ International Power Conversion, Nurnberg, Germany, Jun. 6-8, 2000, pp. 1-4.

* cited by examiner

QUASI-VERTICAL LDMOS DEVICE HAVING CLOSED CELL LAYOUT

FIELD OF THE INVENTION

The present invention relates to semiconductor structures and more particularly to lateral double diffused MOS (LDMOS) transistors.

BACKGROUND OF THE INVENTION

Power MOSFETs (metal oxide semiconductor (MOS) field effect transistors (FET)) are used as electric switches for high frequency PWM (pulse width modulation) applications such as voltage regulators and as load switches in general power applications. When used as load switches where switching times are usually long, cost, size and on-resistance of the switches are the prevailing design considerations. The primary concern with power devices used as load switches is low specific on resistance ($R_{ds,on}$*Area). When used in PWM applications, the transistors must exhibit small power loss during switching, which imposes an additional requirement—small internal capacitances—that make the MOSFET design challenging and often times more expensive.

Vertical double diffused MOSFET (VDMOS) having vertical current flow are known in the art for medium voltage power applications, e.g., from about 50-600V. Vertical trench devices have been reported for power applications between 12-150V.

There are three popular cell geometries for the layout of VDMOS devices: stripe, square closed cell (i.e., checkerboard) and hexagonal. The stripe layout is typically preferred for power devices because it allows for smaller cell dimensions, leads to an improved avalanche ruggedness of the transistor and leads to lower specific $R_{ds,on}$, as described in, for example, Anthony Murray, et al., "New Power MOSFET Technology with Extreme Ruggedness and Ultra-Low $R_{DS(on)}$ Qualified to Q101 for Automotive Applications," in *Proceedings of PCIM* 2000 *Europe, Power Conversion*, paper PC 4.5, pp. 103-107, Nürnberg 2000. The conclusions made by Murray, et al. reflect the state of the art using medium to large cell pitches (e.g., 2.5 to 5 μm) typical for products designed for medium to high drain voltages (e.g., >60V). Another popular layout for these types of products uses a hexagonal cell pattern.

Prior art lateral double diffused MOSFET (LDMOS) devices have been employed for low power, high frequency applications, such as high frequency signal amplification where specific on-resistance is not a real concern. These LDMOS devices use thick epitaxial layers to achieve the breakdown voltages (>60V) required for the target RF applications. The primary concern with these high frequency devices is parasitic component values. To minimize the parasitic source inductance in the assembly, devices are designed on P+ substrates leading the source electrode to the back side of the die. The thick epitaxial layer and P+ substrate results in a high on resistance ($R_{ds,on}$) in the device, which is not acceptable for power management applications as explained above. The RF devices are typically arranged in a stripe layout. This in turn leads to a de-biasing effect known for lateral devices (voltage drop along a stripe electrode under high current conditions) and limits the current handling capability of the device. Further, the shield gate tends to be laterally constrained to the space between the gate and the drain electrodes and is applicable only to a stripe layout of the drain electrode.

LDMOS devices have also been proposed as power devices for 20-30V applications. Stripe and closed cell layouts have been proposed by Andy Strachan et al., "Optimization of LDMOS Array Design for SOA and Hot Carrier Lifetime," 2003 IEEE 15th International Symposium on Power Semiconductor Devices and ICs, 2003 Proceedings, ISPSD '03. Strachan et al. conclude that the stripe cell layout is preferred for better safe operating area (SOA) and improved hot carrier reliability while keeping similar, or even lower, specific on resistance than checkerboard types of closed cell geometries. The reported reliability problems are due to the bipolar action of the parasitic NPN transistor formed by the source, body and drift regions. This transistor is triggered by the voltage drop between the P-body in the channel and the P+ contact caused by hole current from impact ionization. The way to avoid the action of the parasitic bipolar transistor is to reduce the sheet resistance Rb of the P-body so far that the voltage drop on Rb stays below 0.7V. This approach, however, is limited by the design rule requesting that a specific distance between the P+ contact and the polysilicon gate be kept larger than a minimum value defined by the technology generation, i.e., 0.5 μm for a 0.5 μm technology.

There is an ever increasing need for low voltage power devices, such as for power switches used in consumer portable electronic devices which are battery operated and do not use drain voltages exceeding 10V. As yet, the technologies described above have not met the demand for an improved specific $R_{ds,on}$ and size for low voltage power devices.

SUMMARY OF THE INVENTION

A low voltage power device is provided. The power device includes a plurality of quasi-vertical MOS device cells arranged in a closed cell configuration. In embodiments, the closed cell configuration is a checkerboard or hexagonal arrangement.

In one embodiment, each device cell includes a doped substrate and an epitaxial layer having an upper surface. Source and drain regions of a first conductivity type are formed in the epitaxial layer proximate the upper surface of the epitaxial layer, the source and drain regions being spaced from one another and having a channel region of a second conductivity type formed therebetween. A conductive gate is formed over a gate dielectric layer formed over the channel region. The conductive gate partially overlaps the source and drain regions. A conductive trench sinker is formed through the epitaxial layer and adjacent a selected one of the source and drain regions. The trench sinker electrically couples the selected one of the source and drain regions to the substrate for coupling current from the channel to the substrate. An insulator layer is formed over the epitaxial layer and conductive gate. The resulting device exhibits a vertical current flow between the metal electrode covering the front surface and the second electrode formed at the back side of the wafer. The plurality of device cells is arranged in a closed cell configuration.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

As used herein, the following dopant concentrations are distinguished using the following notations:
(a) N++ or P++: dopant concentration $>5 \times 10^{19}$ atoms/cm$^3$;
(b) N+ or P+: dopant concentration of $1 \times 10^{18}$ to $5 \times 10^{19}$ atoms/cm$^3$;
(c) N or P: dopant concentration of $5 \times 10^{16}$ to $1 \times 10^{18}$ atoms/cm$^3$;
(d) N− or P−: dopant concentration of $1 \times 10^{15}$ to $5 \times 10^{16}$ atoms/cm$^3$;
(e) N−− or P−−: dopant concentration $<1 \times 10^{15}$ atoms/cm$^3$.

Figure 1:
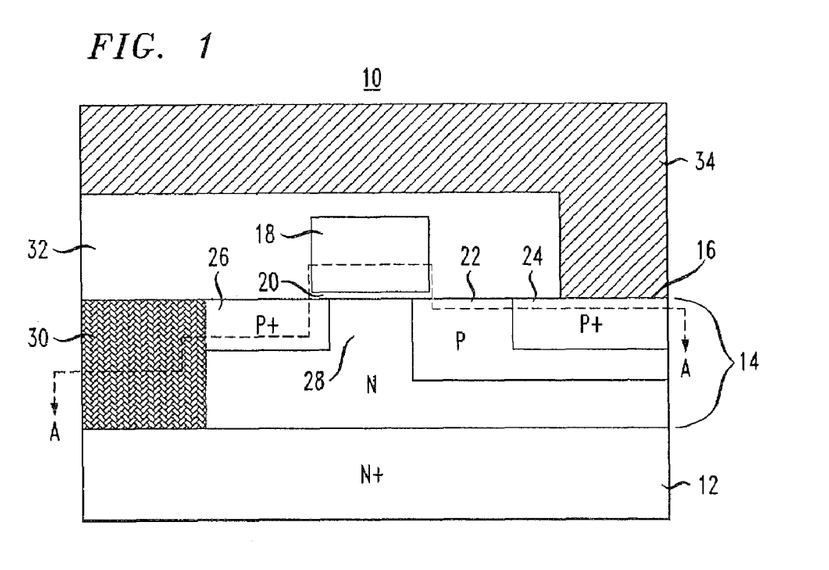
FIG. 1 is cross-sectional view of an exemplary p-channel quasi-vertical LDMOS device for use in a closed cell configuration.

FIG. 1 is a cross-sectional view of a p-channel LDMOS device with vertical current flow, sometimes referred to herein as a "quasi-vertical LDMOS device." Device 10 includes a semiconductor substrate or wafer 12, typically a silicon substrate. The silicon substrate 12 is doped to a N+ dopant concentration comprising n-dopants such as phosphorous or arsenic. In an exemplary embodiment, substrate 12 has a thickness of less than 100 μm, and preferably less than about 75 μm (about 3 mils), and most preferably has a thickness equal to about 50 μm (2 mils), thereby minimizing the contribution of the substrate 12 to the on-resistance of the transistor. The substrate can be grinded, etched, or otherwise formed to this desired thickness. Such thinning processes, if undertaken, would typically be done toward the end of the processing of the substrate wafer. Although not shown, a source electrode is coupled to the bottom surface of the wafer 12 during packaging of the device. Although in embodiments the substrate may be doped to with P-type dopants to a concentration of, for example, P+, an N+ doped substrate is preferred for improved $R_{ds,on}$ results.

A doped silicon epitaxial layer 14 is formed over the substrate 12 and has an upper surface 16. The epitaxial layer 14 has an initial dopant concentration low enough so as to not compensate for the doping of the implanted regions, typically less than $1 \times 10^{16}$ atoms/cm$^3$. The epitaxial layer 14 is preferably relatively thin in order to limit its contribution to $R_{ds,on}$ and to facilitate accurate formation of the contact regions. In one embodiment, the thickness of the epitaxial layer 14 is between about 1.5-4.0 μm, and preferably about 2.5 μm for 12 to 20V class of power switches. With the present device, the original doping of the epitaxial layer 14 has no effect on the resistance of the device because current flows through the vertical source contact region 30 (discussed below).

A conductive gate 18 overlies the upper surface 16 of the epitaxial layer 14. An exemplary conductive gate 18 comprises a doped polysilicon layer preferably with an upper silicide layer (not shown) formed therein or thereover. The conductive gate 18 preferably has a thickness between about 0.3 to 0.6 μm and a length defined by the technology generation utilized in its fabrication, e.g., 0.8 μm, 0.5 μm, 0.35 μm., 0.25 μm, etc. The conductive gate 18 is formed over a gate dielectric layer 20, comprising for example SiO$_2$ or SiO$_x$N$_y$, formed to a thickness between about 100 to 500 Å.

Lightly doped drain (LDD) region 22 is formed completely within epitaxial layer 14 and forms an enhanced drift region adjacent to more heavily doped drain implant region 24 and spaced from more heavily doped source implant region 26. The LDD region 22 preferably extends below (i.e., is overlapped by) the conductive gate 18 between about 0.05 to 0.15 μm. The enhanced drain drift region 22 increases the drain-to-source breakdown voltage of the LDMOS structure 10. Source and drain regions 24, 26 are heavily doped with P-type dopants, such as boron, to a concentration of P+. The drift region 22 has a dopant concentration P. The source implant region 26 preferably has a depth between about 0.15 to 0.3 μm and also partially underlies the conductive gate between about 0.05 to 0.15 μm.

As mentioned, the epitaxial layer 14 is doped to an initial concentration (N−). A body region 28 is then formed by implantation and has a subregion between the source 26 and lightly doped drain region 22 forming a channel region therebetween. The maximum doping concentration in the channel region is usually between $1 \times 10^{17}$ to $3 \times 10^{17}$ atoms/cm$^3$ setting up the threshold voltage Vth of the transistor. A conductive trench 30 is formed in a trench region formed completely through the epitaxial layer 14 adjacent to and contacting the sidewalls of the source implant region 26 and N-body region 28. The source trench 30 provides an electric short between the P+ source 26 and the N-body region 28, as well as conducts the MOSFET current to the N+ substrate 12, and thus to a source electrode (not shown) provided at the backside of the substrate 12. In one embodiment, the source contact 30 comprises a sinker, i.e., a conductive material deposited to fill the trench. In exemplary embodiments, the sinker comprises N+ doped polysilicon material. In order to provide an electric short between N-type and P-type doped regions the source trench has to incorporate a metal contact (or structure that behaves like a metal contact) to the source 26 and body region 28. In some embodiments, the walls of the source trench 30 can be lined with a conductive material behaving as a metal contact, such as titanium silicide (TiSi$_x$) and the trench itself is filled with a conductive (e.g., doped polysilicon) or insulating (e.g., SiO$_2$) material.

The action of the parasitic bipolar transistor (PNP in this case), which limits the safe operating area (SOA) of the device, can be avoided by two means. First, the distance between the source trench and the polysilicon gate is kept less than or equal to about 0.4 μm for 0.35 μm technology. Second, the same doping type is used for the body region 28 and the substrate 12. By doing so, the minority carriers can flow directly into the substrate and do not have to flow to the top source contact where they would cause a voltage drop.

Hot carriers generated at the PN junction between the body 28 and drain 24 flow through the shortest path into the substrate and do not cause any significant voltage drop underneath the P+ source implant 26. The epitaxial layer 14 will generally include a doping gradient created by dopants diffusing out from the substrate 12 into the epitaxial layer 14. A generally flat or consistent doping corresponding to the initial intentional doping of the epitaxial layer 14 will be present between the top surface 16 of the epitaxial layer 14 and this diffused dopant region. The vertical thickness of the portion of the epitaxial layer 14 with flat doping profile is preferably kept very small, such as $\leq 1.0$ μm, for low voltage MOSFETs, e.g., for $\leq 20$V, just thick enough to incorporate the implanted regions. A thicker region makes formation of the source contact more difficult and its resistance higher.

An insulation layer 32 is formed over the drain and source implant regions 24, 26, over the gate sidewalls (forming sidewall spacers) and upper surface of the gate 18, as well as over the enhanced drain drift region 22. The insulating layer 32 preferably comprises $SiO_2$ or $SiO_xN_y$. It should be understood, however, that insulating layer 32 can comprise several layers of insulating materials collectively forming insulating layer 32. Insulating layer 32 is preferably formed to a thickness of at least 0.05 μm on the sidewalls of the conductive gate 18 and at least 0.1 μm on the top surface of the conductive gate 18. The insulating layer 32 insulates the source and gate regions from the drain contact described below.

A drain electrode 34 is formed through the insulator layer 32 to electrically couple to the drain implant region 24 and also over the insulator layer 32. A drain contact, such as a silicide contact layer, optionally may be formed on or in the drain implant region 24 to make contact with the drain electrode 34. In exemplary embodiments, the drain electrode comprises W and/or Al.

Figure 2:
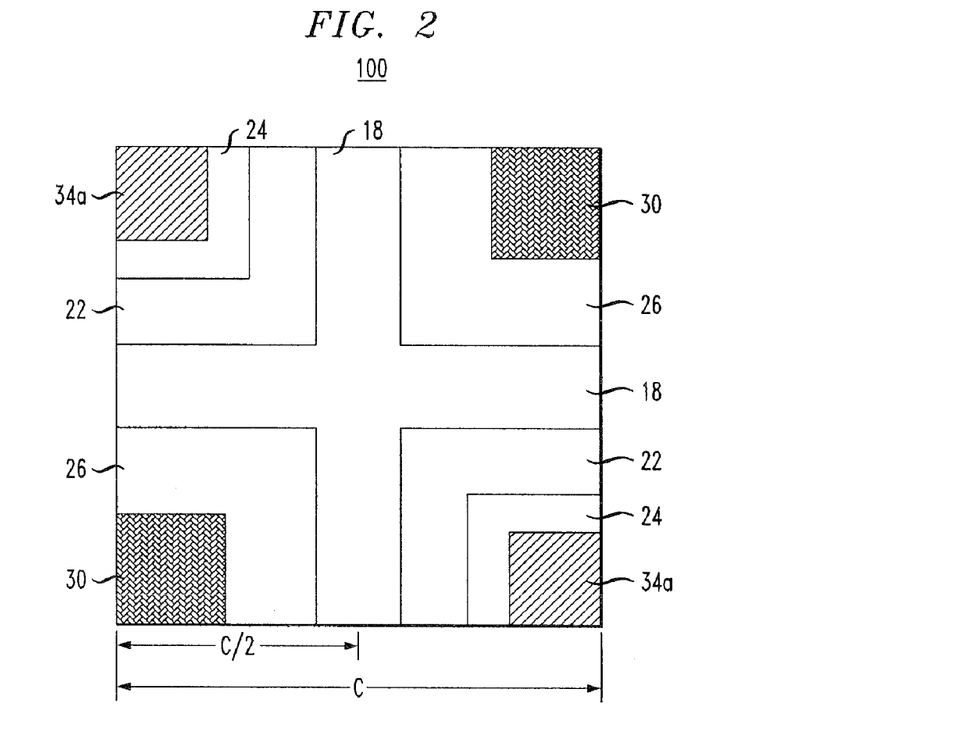
FIG. 2 is a top plan view taken along line A-A of FIG. 1 of an exemplary quasi-vertical LDMOS device cell.
Figure 2A:
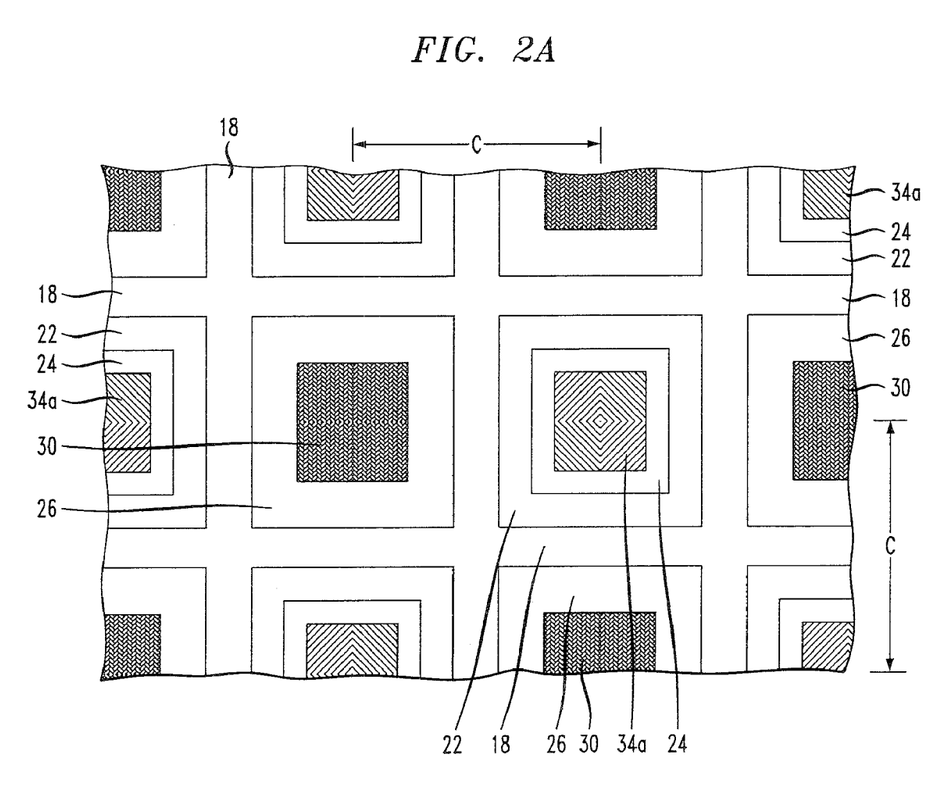
FIG. 2A is a top plan view of a plurality of device cells of FIG. 2 arranged in a closed cell layout.

FIG. 2 illustrates a top plan view of a portion of a closed cell layout of individual quasi-vertical LDMOS devices 10 described in connection with FIG. 1. More specifically, FIG. 2 is a top plan view of an individual quasi-vertical LDMOS device cell (also called a "macro-cell") 100 from a checkerboard closed cell arrangement of quasi-vertical LDMOS devices. The views of individual devices are seen from the vantage of line A-A of FIG. 1. Like reference numbers represent like features. Reference 34a identifies a drain contact, such as silicide contact, described above but not shown in FIG. 1. FIG. 2A is an expanded top plan of the closed cell checkerboard layout of FIG. 2 showing a plurality of device cells.

As can be seen from FIG. 2, each quasi-vertical LDMOS device macro-cell 100 has a centralized symmetrical cross shaped polysilicon gate 18 allowing for the formation of four source/drain pairs per macro-cell on opposite sides of individual arms of said conductive gate 18. As best seen from FIG. 2A, the closed cell checkerboard structure is formed by forming open square shaped drain regions 24, LDD regions 22, and source regions 26 along with closed square shaped drain contacts 34a and source trenches 30.

Figure 3:
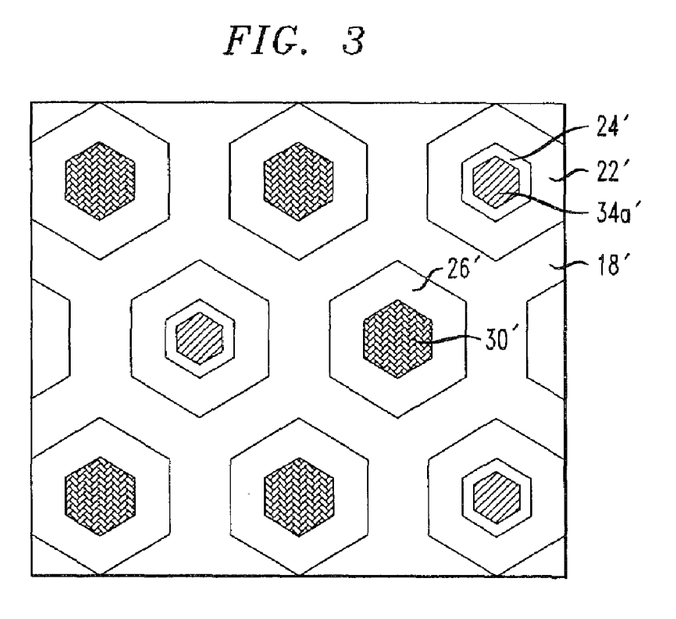
FIG. 3 is a top plan view of an alternative hexagonal closed cell layout arrangement for the quasi-vertical LDMOS device of FIG. 1.
Figure 6:
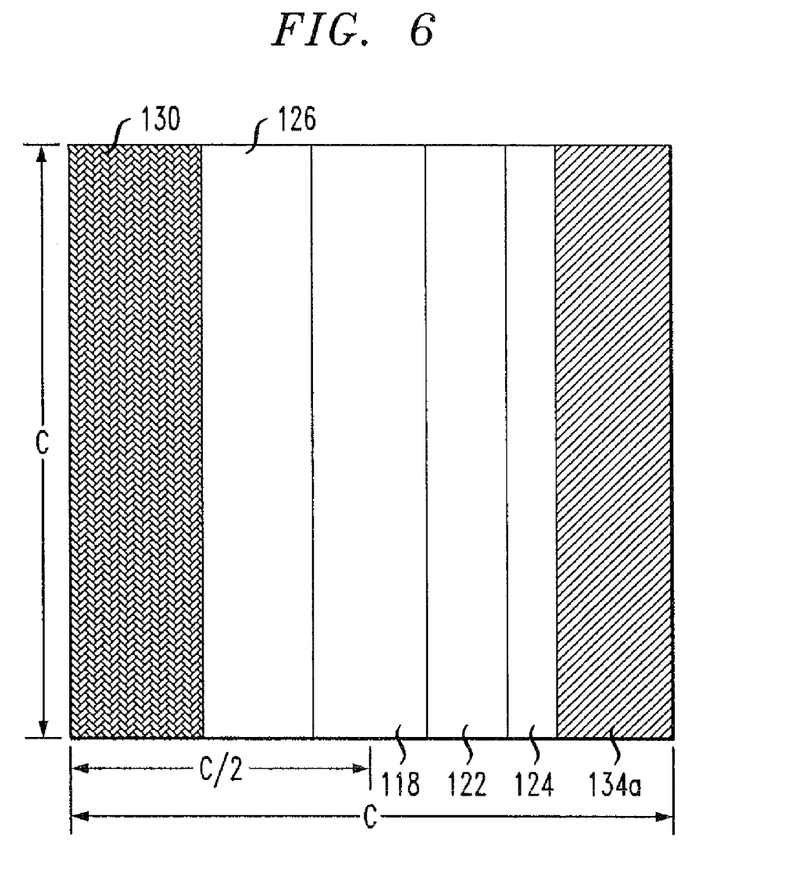
FIG. 6 is a top plan view of a quasi-vertical LMDOS device cell implemented in a stripe layout.

For purposes of comparison with the closed cell macro-cell of FIG. 3, FIG. 6 illustrates a top plan view of a quasi-vertical LDMOS device macro-cell arranged in a stripe layout having conductive source trench 130, source region 126, polysilicon gate 118, LDD region 124 and drain contact 134a.

It should be understood from FIG. 2A that a low voltage, high power device includes a plurality of LDMOS devices 10 arranged in a checkerboard, closed cell layout. Though not shown so as to avoid obscuring the other device features, the cell devices share a common electrode formed over a common insulator layer and having portions extending through the insulator layer to make electrical contact to either the source or drain regions, depending on the conductivity of the device. The number of LDMOS devices is selected according to the targeted $R_{ds,on}$ of the product. A pitch size (C in FIG. 2) of about 2 μm for one macro-cell leads to an LDMOS cell density of about 250,000 macro-cells per 1 $mm^2$ and a specific on-resistance (Rds,on*A) between 10 and 30 $mΩ*mm^2$. In this example, depending on the used technology, a product specified at 10 mΩ will require between 250,000 and 750,000 LDMOS devices connected in parallel according to the checkerboard layout. As explained below, the gate width (Wg) is almost doubled when compared with a stripe layout having the same pitch, which leads to improved specific on-resistance.

The macro-cell of a checkerboard layout is symmetrical with the polysilicon gate 18 placed at the center. FIG. 2A shows the convergence of six macro-cells. The low value of the maximum drain to source voltage required for low voltage products allows for a design of short p-doped LDD region 22, e.g., ≦1.0 μm. This in turn allows for a small pitch (C) of the macro-cell shown in FIG. 2, in turn enabling higher channel density per area and increased power.

The pitch of the macro-cell is preferably less than about 2.5 μm, and preferably about 2.0 μm. Examples of dimensions for a 12V p-channel device in 0.35 μm technology are as follows:
 (a) ½ source trench: 0.4 μm;
 (b) p+ source: 0.4 μm;
 (c) polysilicon gate: 0.5 μm;
 (d) P-LDD: 0.4 μm;
 (e) P+ drain: 0.4 μm; and
 (f) ½ drain contact formed over drain: 0.2 μm.

With these dimensions, the pitch (C) of the macro-cell is 2.1 μm. Dimension of, for example, the trench, source and drain regions follow the minimum design rules of the specific technology. Dimensions of other features, like the gate and LDD, are designed to meet the electrical performance of the product. Techniques for selecting the dimensions of these features are familiar to those skilled in the art.

The gate width (Wg) is the length of the interface border between the source and the drain regions underneath of the polysilicon stripe. Implementation of the quasi-vertical LDMOS device 10 of FIG. 1 in a stripe layout results in a gate width of about 2.1 μm, compared to 3.2 μm (4×0.8 μm) for the proposed closed cell layout. Assuming the center of the cell underneath the crossing stripes is non-active, there are four polysilicon arms that are 0.8 μm each in length. This increase in the gate width leads to an improvement in specific on resistance by ($R_{ds,on}$*A) by about 30% using basic Ids(Vds) formulas for the MOSFET where Ids is proportional to Wg. At the same time, the quasi-vertical design of the transistor 10 helps to avoid reliability problems known for VDMOS and LDMOS devices.

FIG. 3 illustrates that other closed cell layouts, such as a hexagonal layout, are also contemplated, though the illustrated hexagonal arrangement for the various elements in the LDMOS device is not as efficient in increasing gate width as the checkerboard closed cell layout of FIG. 2. In FIG. 3, like elements from FIG. 2 are labeled with a prime ('), i.e., polysilicon gate 18', lightly doped drain region 22', drain region 24', drain contact 34a', source region 26' and source trench 30'.

Figure 4:
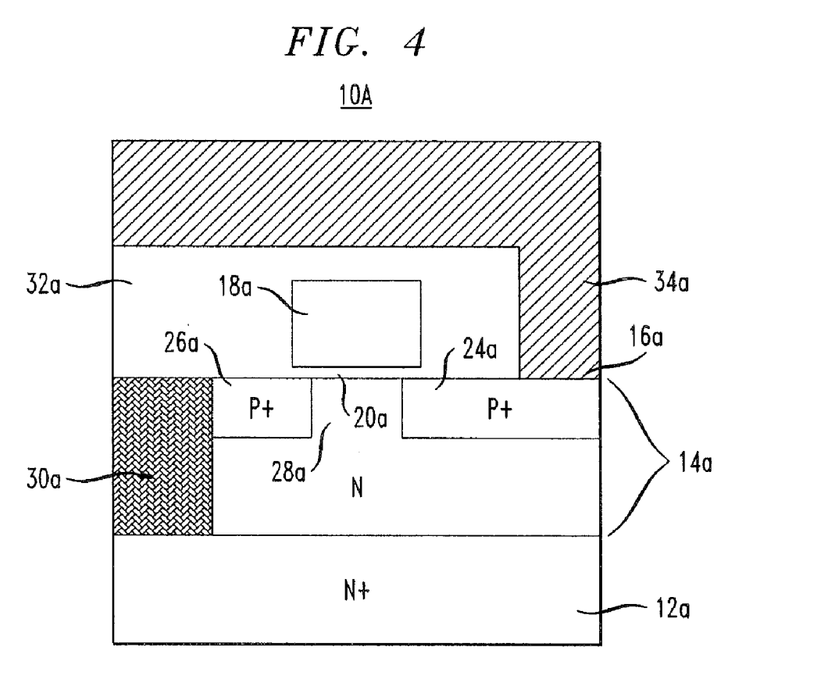
FIG. 4 is a cross-sectional view of an alternative embodiment of the quasi-vertical LDMOS device of FIG. 1.

FIG. 4 is a cross-sectional view of a simplified design of the quasi-vertical p-channel LDMOS device 10 of FIG. 1, where the LDD region has been removed and replaced with an extended drain implant region 24a. The device 10a includes substrate 12a and epitaxial silicon layer 14a having a top surface 16a. The epitaxial layer 14a is n-doped to form body region 28a. Drain region 24a extends to partially underlie gate 18a. Source region 26a is also provided. Like device 10, the device 10a also includes an insulator layer 32a, gate insulator 20a, drain electrode 34a and source trench conductor 30a. This design can be applied to products with a VDS, max specification below 10V where an LDD is not needed. The design, while simplified, is still a quasi-vertical MOSFET, which utilizes a source trench contact 30a to lead current to an N+ substrate 12a, which is coupled to a backside source electrode (not shown).

Figure 5:
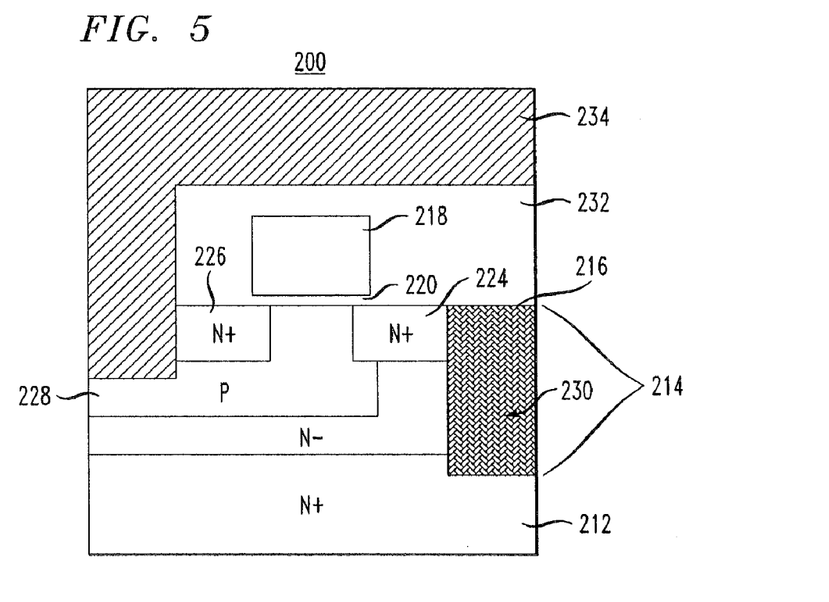
FIG. 5 is a cross-sectional view of an embodiment of an n-channel quasi-vertical MOS device.

As shown in FIG. 5, the quasi-vertical MOSFET from FIG. 4 device may also be implemented as an n-channel device where the location of the source and drain is reversed. The device 200 includes N+ doped substrate 212, N− doped epitaxial layer 214 with top surface 216, P doped body region 228, N+ doped source implant region 226, N+ doped drain implant region 224, gate insulator layer 220, insulator layer 232, and polysilicon gate 218. A source electrode 234 is formed over the insulator layer 232 and through the insulator layer 232 to make electrical contact to the source implant and body regions 226, 228. The source electrode extends partially through the epitaxial layer and adjacent to the source implant region 226 to make electrical contact with both the implant region 226 and the body region 228, shorting the implant region 226 and body 228 together. The N+ substrate 212 is electrically connected to the implanted drain region 224 by a conductive drain trench structure 230. The drain trench 230 can be formed in the same manner as source trench 30 of device 10 of FIG. 2. For example, the drain trench walls can be lined with a conductive material and the trench filled with a conductive or insulating material. Alternatively, a high dose of N+ dopant atoms can be implanted into the walls of the drain trench 230, and the trench 230 can be filled with a doped polysilicon. As shown in FIG. 5, with P-channel devices, no LDD region is needed for Vds smaller than about 10V.

The following table estimates the impact of the cell layout of FIG. 2 on the specific resistance of the LDMOS device. The values are based on numerical simulation data provided for a device design in a 0.35 μm technology. It should be understood that the cell density results from the pitch size, which in turn reflects the technology used in making the device. This simulation assumed a device pitch of 2.1 μm as discussed above. The specific resistance units correspond to an Rds,on of a device with an active area of 1 mm$^2$.

|  | Layout | Vdsmax = −20 V Vgsmax = −12 V | Vdsmax = −20 V Vgsmax = −8 V | Vdsmax = −12 V Vgsmax = −8 V |
|---|---|---|---|---|
| | Comparison of P-channel devices | | | |
| $R_{ds,on}*A$ [mΩ*mm2] at Vgs = −4.5 V | Stripe | 30.3 | 23 | 14 |
| | Closed cell | 23 | 16 | 12 |

From the foregoing, a checkerboard closed cell layout is implemented with low voltage (e.g., ≦20V) LDMOS devices with quasi-vertical current flow, resulting in a significant reduction of specific on resistance when compared with equivalent stripe design. A quasi-vertical device design using 0.35 μm or better design rules helps to avoid reliability problems. The source length defining the distance between the channel and the source contact can be made as small as 0.4 μm, reducing the voltage drop along the body region underneath source, and in turn helping to avoid bipolar effect as described above. In one exemplary application, the low voltage power device is employed as a power switch in a consumer portable electronic device, such as a cellular phone, that is battery operated and does not use drain voltages exceeding 10V.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A low voltage power device comprising a plurality of quasi-vertical LDMOS device cells, wherein each device cell comprises:
    a doped substrate and an epitaxial layer formed thereover having an upper surface;
    source and drain regions of a first conductivity type formed in the epitaxial layer proximate the upper surface of said epitaxial layer, said source and drain regions being spaced from one another and having a channel region of a second conductivity type formed therebetween;
    a conductive gate, said conductive gate formed over a gate dielectric layer formed over said channel region, said conductive gate partially overlapping said source and drain regions;
    a conductive trench sinker formed though said epitaxial layer and adjacent a selected one of said source and drain regions, said trench sinker electrically coupling said selected one of said source and drain regions to said substrate for coupling current from said channel to said substrate; and
    an insulator layer formed over said epitaxial layer and conductive gate;
    wherein said plurality of device cells is arranged in a closed cell configuration,
    said low voltage power device further comprising a pair of source and drain electrodes, one of the drain and source electrodes being disposed over said epitaxial layer and the other of the drain and source electrodes being disposed at a bottom side of said substrate,
    wherein said conductive gate is cross shaped, with said source and drain regions formed on opposite sides of individual arms of said conductive gate.

2. The device of claim 1, wherein said closed cell configuration is a checkerboard layout.

3. The device of claim 1, wherein said substrate comprises a silicon substrate highly doped with N-type dopants.

4. The device of claim 3, wherein said first conductivity type is P-type conductivity and said second conductivity type is N-type conductivity.

5. The device of claim 4,
    wherein said epitaxial layer is doped with N-type dopants,
    wherein said conductive trench sinker is formed adjacent said source region, and
    wherein said drain electrode is formed over said insulator layer and through said insulator layer to make electrical contact to said drain region.

6. The device of claim 5, wherein said drain region comprises a lightly doped region formed adjacent said channel region and a more heavily doped region spaced from said channel region coupled to said drain electrode.

7. The device of claim 5, wherein said drain region comprises a heavily doped region formed adjacent said channel region and coupled to said drain electrode.

8. The device of claim 3, wherein said first conductivity type is N-type conductivity and said second conductivity type is P-type conductivity.

9. The device of claim 8,
wherein said epitaxial layer is doped with N-type dopants,
wherein said epitaxial layer further comprises a P-type body comprising said channel region and having a portion extending under said source region,
wherein said trench sinker is formed adjacent said drain region, and
wherein said source electrode is formed over said insulator layer and through said insulator layer to make electrical contact to said source region.

10. The device of claim 9, wherein said source electrode is further formed in a shallow trench formed through the source region to contact said P-type body.

11. The device of claim 1, wherein the pitch of said device cell is less than 2.5 µm.

12. The device of claim 1, wherein the pitch of said device cell is about 2.0 µm.

13. The device of claim 1, wherein said device cells share a common gate defining the pattern of said closed cell configuration.

14. A low voltage power device comprising:
a heavily doped substrate doped with N-type dopants, said substrate having an epitaxial layer formed thereover; and
a plurality of quasi-vertical LDMOS device cells arranged in a closed cell, checkerboard arrangement, each device cell comprising:
a plurality of pairs of source and drain regions of a first conductivity type formed in the epitaxial layer proximate the upper surface of said epitaxial layer, individual source and drain regions of a pair being spaced from one another and having a respective channel region of a second conductivity type formed therebetween in said epitaxial layer;
a conductive gate formed over a gate dielectric layer formed over said channel regions, said conductive gate partially overlapping said source and drain regions;
a plurality of conductive trench sinkers formed through said epitaxial layer and adjacent individual ones of either said source or drain regions, said trench sinkers electrically coupling said individual ones of said source or drain regions to said substrate for coupling current from said channels to said substrate; and
an insulator layer formed over said epitaxial layer and said conductive gate,
wherein said device cells share a common gate defining the pattern of said closed cell configuration, and
wherein said low voltage power device further comprises a pair of source and drain electrodes, one of the drain and source electrodes being disposed over said epitaxial layer and the other of the drain and source electrodes being disposed at a bottom side of said substrate,
wherein said conductive gate is cross shaped, with respective pairs of source and drain regions formed on opposite sides of individual arms of said conductive gate.

15. The device of claim 14, wherein said first conductivity type is P-type conductivity and said second conductivity type is N-type conductivity.

16. The device of claim 14, wherein said first conductivity type is N-type conductivity and said second conductivity type is P-type conductivity.

17. The device of claim 14, wherein one of the source and drain electrodes is provided by an electrode layer formed over said insulator layer, said electrode layer comprising portions formed through said insulator layer to make electrical contact with the other ones of either said source or drain regions.

18. The device of claim 17,
wherein said first conductivity type is P-type conductivity and said second conductivity type is N-type conductivity,
wherein said conductive trench sinkers are formed adjacent said source regions, and
wherein said electrode layer is electrically coupled to said drain regions.

19. The device of claim 18, wherein said drain regions each comprise a lightly doped region formed adjacent a respective channel region and a more heavily doped region spaced from said respective channel region and coupled to said electrode layer.

20. The device of claim 17,
wherein said first conductivity type is N-type conductivity and said second conductivity type is P-type conductivity,
wherein said epitaxial layer comprises P-type body regions comprising said channel regions and having portions extending under said source regions,
wherein said trench sinkers are formed adjacent said drain regions, and
wherein said electrode layer makes electrical contact to said source regions, said portions of said electrode layer formed partially though said epitaxial layer adjacent respective source regions to contact said P-type body regions.

21. The device of claim 14, wherein said conductive gate comprises polysilicon.

22. A low voltage power device comprising:
a heavily doped substrate doped with N-type dopants, said substrate having an epitaxial layer formed thereover; and
a plurality of quasi-vertical LDMOS device cells arranged in a closed cell, checkerboard arrangement, each device cell comprising:
a plurality of pairs of source and drain regions of a first conductivity type formed in the epitaxial layer proximate the upper surface of said epitaxial layer, individual source and drain regions of a pair being spaced from one another and having a respective channel region of a second conductivity type formed therebetween in said epitaxial layer;
a conductive gate formed over a gate dielectric layer formed over said channel regions, said conductive gate partially overlapping said source and drain regions, wherein said conductive gate is cross shaped, with respective pairs of source drain regions formed on opposite sides of individual arms of said conductive gate;
a plurality of conductive trench sinkers formed through said epitaxial layer and adjacent individual ones of either said source or drain regions, said trench sinkers electrically coupling said individual ones of said source or drain regions to said substrate for coupling current from said channels to said substrate; and
an insulator layer formed over said epitaxial layer and said conductive gate.

* * * * *

UNITED STATES PATENT AND TRADEMARK OFFICE
CERTIFICATE OF CORRECTION

PATENT NO.         : 7,446,375 B2
APPLICATION NO.    : 11/376470
DATED              : November 4, 2008
INVENTOR(S)        : Shuming Xu and Jacek Korec

Page 1 of 1

It is certified that error appears in the above-identified patent and that said Letters Patent is hereby corrected as shown below:

At Col. 8, Line 16: delete "though" and substitute therefor --through--; and
At Col. 10, Line 30: delete "though" and substitute therefor --through--.

Signed and Sealed this

Third Day of February, 2009

JOHN DOLL
*Acting Director of the United States Patent and Trademark Office*